United States Patent
Lee et al.

(10) Patent No.: US 8,305,554 B2
(45) Date of Patent: Nov. 6, 2012

(54) ROLL-TO-ROLL TYPE APPARATUS FOR FORMING THIN FILM PATTERN

(75) Inventors: Young Woo Lee, Gyunggi-do (KR); Jeong Min Cho, Gyunggi-do (KR); Dong Joo Shin, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 773 days.

(21) Appl. No.: 12/401,442

(22) Filed: Mar. 10, 2009

(65) Prior Publication Data
US 2010/0053577 A1    Mar. 4, 2010

(30) Foreign Application Priority Data
Aug. 29, 2008    (KR) .................. 10-2008-0085461

(51) Int. Cl.
*G03B 27/42* (2006.01)

(52) U.S. Cl. ................ 355/53; 355/47; 355/71

(58) Field of Classification Search .............. 355/47, 355/53, 71
See application file for complete search history.

(56) References Cited

U.S. PATENT DOCUMENTS
| | | |
|---|---|---|
| 2005/0008778 A1 | 1/2005 | Utsugi et al. |
| 2006/0096537 A1* | 5/2006 | Tuttle ..................... 118/720 |
| 2007/0026141 A1 | 2/2007 | Nakayama et al. |
| 2007/0137568 A1 | 6/2007 | Schreiber |

FOREIGN PATENT DOCUMENTS
| | | |
|---|---|---|
| JP | 07-011442 | 1/1995 |
| JP | 2000017426 A | 1/2000 |
| JP | 2000-183500 | 6/2000 |
| JP | 2001003155 A | 1/2001 |
| JP | 2001-148377 | 5/2001 |
| JP | 2003162999 A | 6/2003 |
| JP | 2007002295 A | 1/2007 |

(Continued)

OTHER PUBLICATIONS

Korean Office Action issued in Korean Patent Application No. 10-2008-0085461, dated May 31, 2010.

(Continued)

*Primary Examiner* — Toan Ton
*Assistant Examiner* — Mesfin T Asfaw
(74) *Attorney, Agent, or Firm* — McDermott Will & Emery LLP

(57) ABSTRACT

An apparatus for forming a thin film pattern according to an aspect of the invention may include: an unwinding roll and a winding roll running a sheet; a rotary drum having an elastic layer provided on a circumferential surface thereof, and disposed between the winding roll and the unwinding roll to run the sheet along the circumferential surface; a source containing unit accommodating a deposition source and mounted such that the deposition source is evaporated and the evaporated deposition source moves toward the sheet located on the rotary drum; a shutter selectively preventing the movement of the deposition source toward the rotary drum from the source containing unit; a mask having a pattern defining a pattern of a thin film to be deposited onto the sheet and making tight contact with the sheet located on the rotary drum during thin-film deposition; and a tensioning unit pressurizing the sheet in a direction of the rotary drum to allow the sheet to run after the thin-film deposition and separating the sheet from the mask by a reduction in thickness.

6 Claims, 3 Drawing Sheets

FOREIGN PATENT DOCUMENTS

| | | |
|---|---|---|
| JP | 2007-035161 | 2/2007 |
| JP | 2008520101 A | 6/2008 |
| KR | 10-0620664 | 9/2006 |
| WO | WO-2006053032 A1 | 5/2006 |

OTHER PUBLICATIONS

Japanese Office Action, and English translation thereof, issued in Japanese Patent Application No. 2009-079240 dated May 8, 2012.

* cited by examiner

ROLL-TO-ROLL TYPE APPARATUS FOR FORMING THIN FILM PATTERN

CROSS-REFERENCE TO RELATED APPLICATIONS

This application claims the priority of Korean Patent Application No. 2008-0085461 filed on Aug. 29, 2008, in the Korean Intellectual Property Office, the disclosure of which is incorporated herein by reference.

BACKGROUND OF THE INVENTION

1. Field of the Invention

The present invention relates to roll-to-roll type apparatuses for forming thin film patterns, and more particularly, to a roll-to-roll type apparatus for forming a thin film pattern that forms a desired thin film pattern on a sheet running between rolls.

2. Description of the Related Art

In general, as digital electronic products have been reduced in size and increased in functionality, various types of passive components have correspondingly been reduced in size, thickness, and weight while functions of the passive components have been upgraded. Especially, a large number of capacitors are used in portable small electronic products, such as camera phones, DMB phones, and navigations. There is growing need to increase the capacity and functionality of the capacitor while the capacity needs to be formed of multilayered ultra-thin films.

However, the existing screen printing method is limited when achieving high-capacity capacitors within the same chip size. In order to overcome this limitation, various kinds of methods have been attempted, and among them, there is a roll-to-roll process. Significant consideration has been given to this roll-to-roll because it is more suitable for mass production than an existing batch type process when implementing a display or a device on a flexible substrate.

The roll-to-roll type apparatus for forming a thin film has advantages of mass production because a process is performed while a sheet is continuously transferred, but it is difficult to form a pattern necessary to manufacture a device. There is a method of forming a layer on a sheet wound in a roll, cutting the sheet, and arranging the cut sheet. However, since this method may not allow mass production, it is difficult to use the method when repeating the formation of a thin film pattern.

To overcome difficulties, there is a method of forming a desired pattern on a sheet running between rolls by using a roll type mask having various patterns as a mask. However, it is difficult to make tight contact with a deposition object in a roll-to-roll process using the roll type mask. Therefore, it is difficult to ensure a precise thin film pattern. When the roll type mask is used, other devices such as a driving roll and a guide roll to move the mask are required.

Further, when any one of the various patterns of the roll type mask is damaged, the repair of the roll type mask is difficult.

Therefore, there is a need for a technique that effectively forms a thin film pattern in a roll-to-roll process.

SUMMARY OF THE INVENTION

An aspect of the present invention provides an apparatus for forming a thin film pattern that can effectively perform a process of forming a thin film pattern while maintaining mass production achieved by a roll-to-roll process.

According to an aspect of the present invention, there is provided an apparatus for forming a thin film pattern, the apparatus including: an unwinding roll and a winding roll running a sheet; a rotary drum having an elastic layer provided on a circumferential surface thereof, and disposed between the winding roll and the unwinding roll to run the sheet along the circumferential surface; a source containing unit accommodating a deposition source and mounted such that the deposition source is evaporated and the evaporated deposition source moves toward the sheet located on the rotary drum; a shutter selectively preventing the movement of the deposition source toward the rotary drum from the source containing unit; a mask having a pattern defining a pattern of a thin film to be deposited onto the sheet and making tight contact with the sheet located on the rotary drum during thin-film deposition; and a tensioning unit pressurizing the sheet in a direction of the rotary drum to allow the sheet to run after the thin-film deposition and separating the sheet from the mask by a reduction in thickness.

The tensioning unit may include a first tensioning roll located between the unwinding roll and the rotary drum and a second tensioning roll located between the rotary drum and the winding roll.

The mask may be mounted onto the rotary drum to make tight contact with the sheet located on the rotary drum.

The apparatus may further include a tension sensor unit measuring tension applied to the sheet.

The sheet may be a dielectric green sheet, and the deposition source may be an electrode material including Ag or Ni.

The sheet may be a flexible substrate.

The thin film may be deposited using one selected from the group consisting of e-beam deposition, thermal deposition, sputtering, ion-beam deposition, and pulse laser deposition.

According to another aspect of the present invention, there is provided an apparatus for forming a thin film pattern, the apparatus including: an unwinding roll and a winding roll; a rotary drum having an elastic layer provided on a circumferential surface thereof, and disposed between the unwinding roll and the winding roll to run the sheet along the circumferential surface; a source containing unit accommodating a deposition source, and mounted such that the deposition source is evaporated and the evaporated deposition source moves toward the sheet located on the rotary drum; a shutter selectively preventing movement of the deposition source toward the rotary drum from the source containing unit; a mask having a pattern defining a pattern of a thin film to be deposited onto the sheet and disposed between the source containing unit and the rotary drum; and a mask moving unit providing tight contact between the mask and the sheet during thin-film deposition and separating the mask and the sheet from each other to allow the sheet to run after the thin-film deposition.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
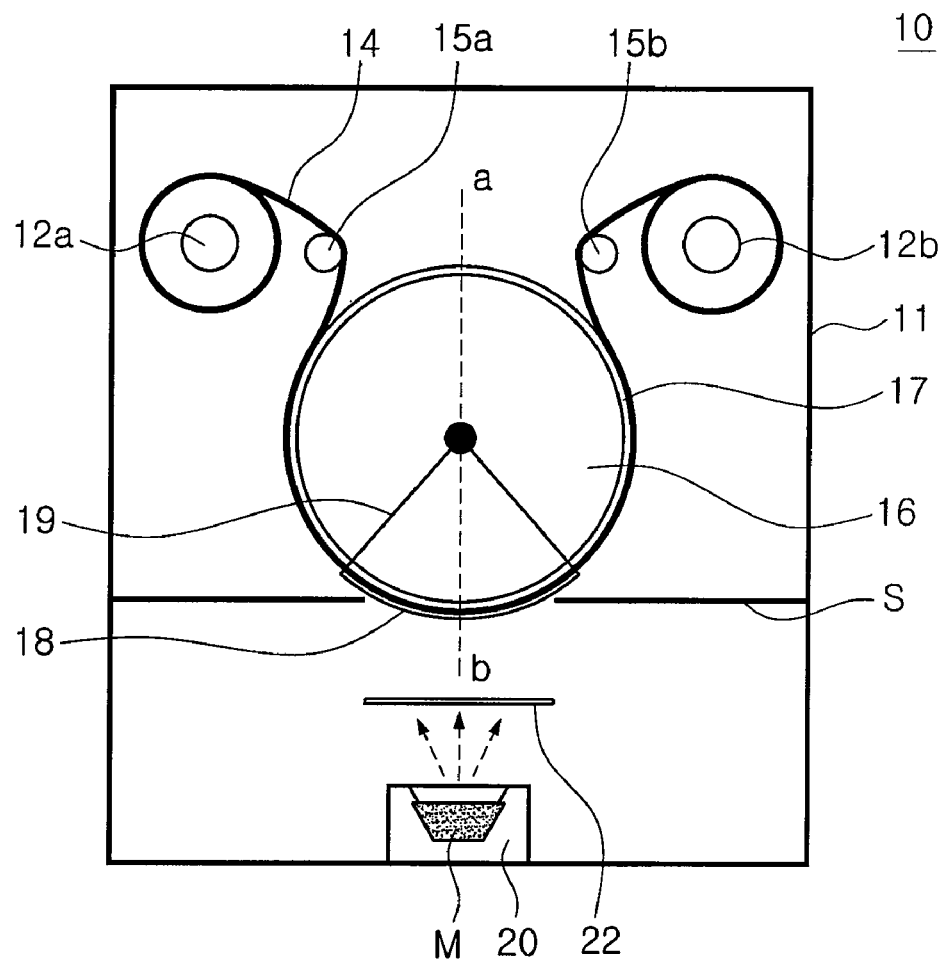
FIG. 1 is a schematic view illustrating an apparatus for forming a thin film pattern according to an exemplary embodiment of the present invention.

FIG. 1 is a schematic view illustrating an apparatus for forming a thin film pattern according to an exemplary embodiment of the invention.

Referring to FIG. 1, a thin film pattern forming apparatus 10 according to this embodiment includes a vacuum chamber 11, an unwinding roll 12a and a winding roll 12b that are disposed inside the vacuum chamber 11 to run a sheet 14, and a rotary drum 16 that is disposed between the unwinding roll 12a and the winding roll 12b.

The sheet 14 moves along a circumferential surface of the rotary drum 16. An area of the sheet 14 that is located on the circumferential surface of the rotary drum 16 is subject to deposition. The rotary drum 16 may be a cooling rotary drum in which a coolant flows.

The rotary drum 16, used in this embodiment, has an elastic layer 17 formed on the circumferential surface thereof. The elastic layer 17 may be formed of a material having restoring force. That is, the material can be reduced by pressurization, and returns to its original state when the pressure is released. For example, the elastic layer 17 may be formed of a polymer that is an elastic body.

The thin film pattern forming apparatus 10 includes a source containing unit 20 that accommodates a deposition source M in the vacuum chamber 11. Though not shown in FIG. 1, the thin film pattern forming apparatus 10 further includes a unit used to evaporate the deposition source M to form a thin film on the surface of the sheet 14, such as an electronic beam. A shielding layer S may be further included to prevent thin-film deposition of another sheet area other than a desired area.

When a deposition area of the sheet 14 is located at the surface of the rotary drum 16 by the unwinding roll 12a and the winding roll 12b, a shutter 22 is opened so that the evaporated deposition source (indicated by arrow) travelling to the rotary drum 16 from the source containing unit 20 can proceed. When the sheet 14 is moved after the deposition is completed, the shutter 22 is closed so that the evaporated deposition source does not travel to the rotary drum 16.

The thin film pattern forming apparatus 10 includes a mask 18 on the sheet 14 that has a pattern corresponding to a desired pattern. In this embodiment, when the sheet 14 does not run, the mask 18 is in tight contact with the sheet 14 located on the rotary drum 16.

Like this embodiment, the mask 18 may be disposed onto the rotary drum 16 by using a known fixing unit 19 such that the mask 18 makes tight contact with the sheet 14 located on the rotary drum 16.

After the thin-film deposition is completed, the sheet 14 is run such that another area of the sheet 14 is located as a deposition area. In order to run the sheet 14, the sheet 14 is pressurized in a direction of the rotary drum 16 by using a tensioning unit. This results in a reduction in thickness of the elastic layer to separate the sheet 14 from the mask 18. As such, when the sheet 14 is separated from the mask 18, smooth movement of the sheet 14 can be ensured.

In this embodiment, the tensioning unit includes a first tensioning roll 15a located between the unwinding roll 12a and the rotary drum 16 and a second tensioning roll 15b located between the rotary drum 16 and the winding roll 12b. Though not shown in FIG. 1, a tension sensor unit (not shown) that measures tension applied to the sheet 14 may be further included.

The present invention can be applied to various kinds of products to improve mass production. For example, the sheet 14 may be a dielectric green sheet, and the deposition source M may be an electrode material, such as Ag or Ni, to form an internal electrode. Alternatively, the sheet 14 may be a flexible substrate, and an electrode material may be deposited to form a circuit pattern.

FIGS. 2A through 2D are schematic views illustrating a process of forming a thin film pattern according to an exemplary embodiment of the invention. That is, FIGS. 2A through 2D are cross-sectional views illustrating the process flow showing a deposition area of the rotary drum 16 to describe sheet running and a thin film forming process in the thin film pattern forming apparatus 10, illustrated in FIG. 1.

Figure 2A:
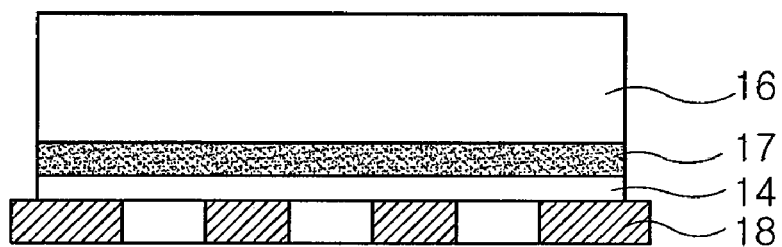
FIGS. 2A through 2D are schematic views illustrating a process of forming a thin film pattern according to the embodiment illustrated in FIG. 1.

As shown in FIG. 2A, the rotary drum 16 has the elastic layer 17 formed on the circumferential surface thereof. The sheet 14 is formed at the surface of the elastic layer 17, and the mask 18 having a desired pattern is disposed on the sheet 14. The mask 18 may be almost disposed in tight contact with the sheet 14. The tight contact between the mask 18 and the sheet 14 allows formation of more precise patterns. As shown in FIG. 1, the mask 18 may be fixed to the rotary drum 16.

Figure 2B:
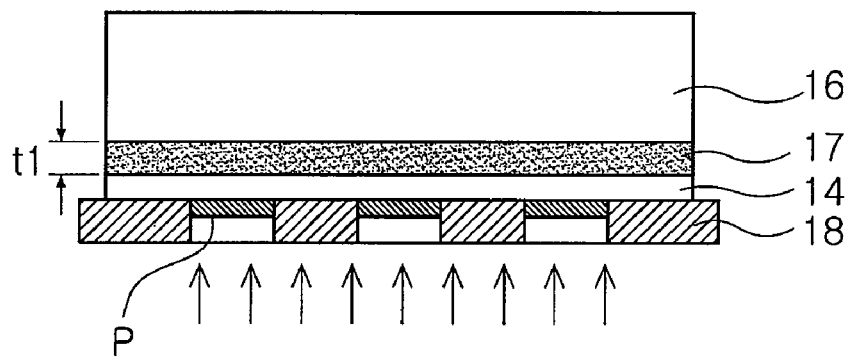

Then, as shown in FIG. 2B, a deposition process is performed on the sheet 14 to form a thin film pattern P. This deposition process may be performed by opening the shutter 22, shown in FIG. 1. The thin-film deposition may be selected from the group consisting of e-beam evaporation, thermal evaporation, sputtering, ion-beam deposition, and pulse laser deposition.

Figure 2C:
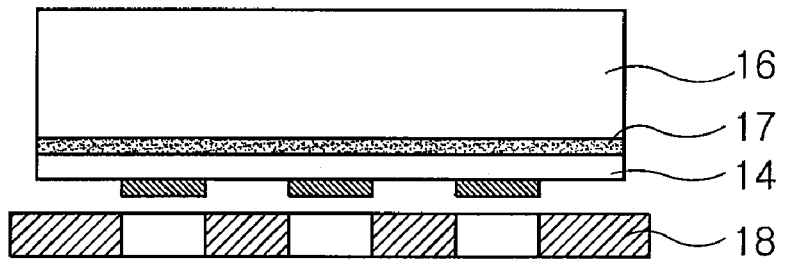

Then, as shown in FIG. 2C, the sheet 14 is compressed against the rotary drum 16 by using the tensioning unit. The compression process causes the elastic layer 17 to be reduced from a first thickness t1 to a second thickness t1'. As such, the reduction in thickness of the elastic layer 17 allows the sheet 14 to be separated from the fixed mask 18.

Figure 2D:
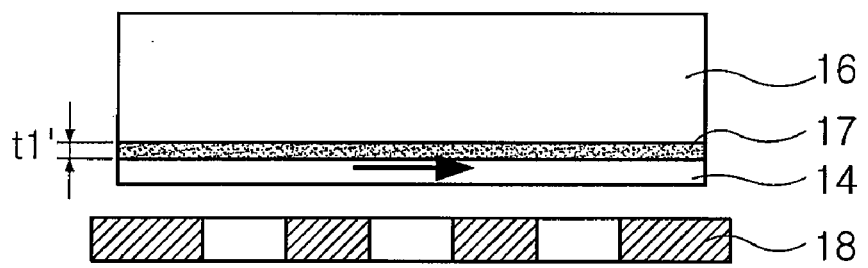

When the tension is applied to the sheet 14, as shown in FIG. 2D, the sheet 14 separated from the mask 18 can smoothly run by driving rolls. After the sheet 14 is moved such that another deposition area is located on the rotary drum 16, the tension is released, and the sheet 14 is ready to undergo deposition as shown in FIG. 2A.

A thin film pattern can be easily formed at a desired deposition position by repeating the processes illustrated in FIGS. 2A through 2D.

FIGS. 3A through 3D are schematic views illustrating a process of forming a thin film pattern in an apparatus for forming a thin film pattern according to another exemplary embodiment of the invention. In this embodiment, a unit that moves a mask is separately provided, and sheet running and a thin film pattern forming process are performed using this unit.

FIGS. 3A through 3D are cross-sectional views illustrating the process flow showing a deposition area of a rotary drum 26 in detail to describe sheet running and a thin film pattern forming process in a thin film pattern forming apparatus 20.

Figure 3A:
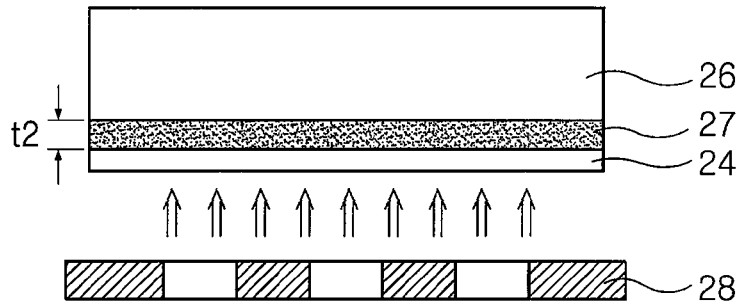
FIGS. 3A through 3D are schematic views illustrating a process of forming a thin film pattern in an apparatus for forming a thin film pattern according to another exemplary embodiment of the present invention.

As shown in FIG. 3A, the rotary drum 26 has an elastic layer 27 formed on a circumferential surface thereof. A sheet 24 is located on the surface of the elastic layer 27. The elastic layer 27 has a relatively large thickness t2 when it is not pressurized. In this embodiment, the sheet 24 is moved to a deposition position by running the sheet 24, and then a mask 28 is located on the sheet 24.

Figure 3B:
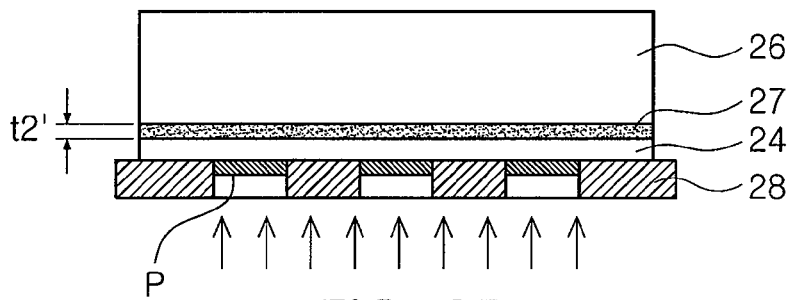

As shown in FIG. 3B, as the mask 28 having a desired pattern is disposed on the sheet 24, and then pressurized, the mask 28 and the sheet 24, where a thin film will be formed, make tight contact with each other. This tight contact therebetween allows formation of more precise patterns. Then, a deposition process is performed on the sheet 24 to form a thin film pattern P. The thin-film deposition may include e-beam evaporation, thermal evaporation, sputtering, ion-beam deposition, and pulse laser deposition.

Figure 3C:
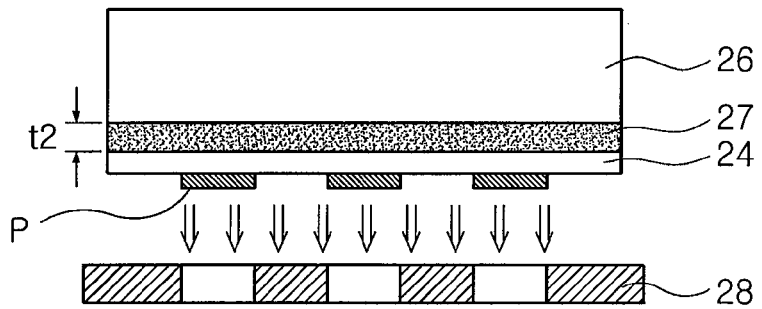

Then, as shown in FIG. 3C, the sheet 24 is compressed against the rotary drum 26. A separate moving unit is used to move the mask 28 so as to be separated from the sheet 24 on which the thin film pattern P is formed. The elastic layer 27 returns to the original thickness t2 after the movement of the mask 28.

Figure 3D:
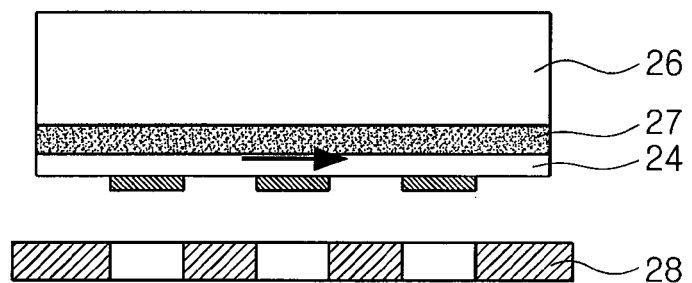

When the mask 28 is separated from the sheet 24, as shown in FIG. 3D, the sheet 24 can smoothly run by driving rolls. After the sheet 14 is moved to another necessary deposition area, the sheet 24 is ready to undergo deposition as shown in FIG. 3A. A thin film pattern can be easily formed at a desired deposition position by repeating the processes illustrated in FIGS. 3A through 3D.

As set forth above, according to exemplary embodiments of the invention, since one mask can make tight contact with a deposition area, a precise thin film pattern can be ensured as compared to when a roll type mask is used. Further, accompanying devices related to a mask are simplified, and running of a sheet can be effectively ensured.

While the present invention has been shown and described in connection with the exemplary embodiments, it will be apparent to those skilled in the art that modifications and variations can be made without departing from the spirit and scope of the invention as defined by the appended claims.

What is claimed is:

1. An apparatus for forming a thin film pattern, the apparatus comprising:
    an unwinding roll and a winding roll running a sheet;
    a rotary drum having an elastic layer provided on a circumferential surface thereof, and disposed between the winding roll and the unwinding roll to run the sheet along the circumferential surface;
    a source containing unit accommodating a deposition source and mounted such that the deposition source is evaporated and the evaporated deposition source moves toward the sheet located on the rotary drum;
    a shutter selectively preventing the movement of the deposition source toward the rotary drum from the source containing unit;
    a mask having a pattern defining a pattern of a thin film to be deposited onto the sheet and making tight contact with the sheet located on the rotary drum during thin-film deposition; and
    a tensioning unit pressurizing the sheet in a direction of the rotary drum to allow the sheet to run after the thin-film deposition and separating the sheet from the mask by a reduction in thickness.

2. The apparatus of claim 1, wherein the tensioning unit comprises a first tensioning roll located between the unwinding roll and the rotary drum and a second tensioning roll located between the rotary drum and the winding roll.

3. The apparatus of claim 1, wherein the mask is mounted onto the rotary drum to make tight contact with the sheet located on the rotary drum.

4. The apparatus of claim 1, wherein the sheet is a dielectric green sheet, and the deposition source is an electrode material including Ag or Ni.

5. The apparatus of claim 1, wherein the sheet is a flexible substrate.

6. The apparatus of claim 1, wherein the thin film is deposited using one selected from the group consisting of e-beam deposition, thermal deposition, sputtering, ion-beam deposition, and pulse laser deposition.

* * * * *